(12) United States Patent
Nakajima et al.

(10) Patent No.: US 8,841,907 B2
(45) Date of Patent: Sep. 23, 2014

(54) CURRENT DETECTING APPARATUS

(75) Inventors: Hirokatsu Nakajima, Yokkaichi (JP); Satoru Chaen, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 270 days.

(21) Appl. No.: 13/368,626

(22) Filed: Feb. 8, 2012

(65) Prior Publication Data

US 2012/0313637 A1 Dec. 13, 2012

(30) Foreign Application Priority Data

Jun. 9, 2011 (JP) ................. 2011-129242

(51) Int. Cl.
*G01R 33/04* (2006.01)

(52) U.S. Cl.
CPC .................... *G01R 33/04* (2013.01)
USPC .................. 324/253; 324/117 R; 324/117 H; 324/127; 324/251; 324/252; 324/126; 324/263; 411/534

(58) Field of Classification Search
CPC .................................................. G01R 19/0092
USPC .................................. 324/253, 263; 411/534
See application file for complete search history.

(56) References Cited

U.S. PATENT DOCUMENTS

| 5,552,700 | A | * | 9/1996 | Tanabe et al. ............. 324/117 H |
| 6,008,634 | A | | 12/1999 | Murofushi et al. |
| 7,316,576 | B2 | | 1/2008 | Saito et al. |
| 7,692,526 | B2 | * | 4/2010 | Hundt ........................... 336/192 |
| 2010/0260580 | A1 | * | 10/2010 | Andersson .................... 411/534 |

FOREIGN PATENT DOCUMENTS

| JP | 10-104279 | 4/1998 |
| JP | 2006-166528 | 6/2006 |
| JP | 2009-058451 | 3/2009 |

* cited by examiner

*Primary Examiner* — Melissa Koval
*Assistant Examiner* — Stephen G Armstrong
(74) *Attorney, Agent, or Firm* — Greenblum & Bernstein, P.L.C.

(57) ABSTRACT

The size of a current detecting apparatus is reduced by employing a small magnetic core, and problems caused by excessive heat generation and vibrations of a bass bar are prevented. In a current detecting apparatus, a current detecting bass bar includes a through portion penetrating through a hollow portion of a magnetic core, and plate-shaped terminal portions continuing from both sides of the through portion. The through portion is formed to have a thickness larger than that of the terminal portions.

7 Claims, 7 Drawing Sheets

CURRENT DETECTING APPARATUS

CROSS-REFERENCE TO RELATED APPLICATIONS

The present application claims priority under 35 U.S.C. §119 of Japanese Application No. 2011-129242, filed on Jun. 9, 2011, which is herein expressly incorporated by reference in its entirety.

TECHNICAL FIELD

The present invention relates to a current detecting apparatus configured to detect an electric current flowing through a bass bar.

BACKGROUND ART

A current detecting apparatus configured to detect an electric current flowing through a bass bar connected to a battery is mounted on vehicles such as hybrid vehicles and electric vehicles in many cases. As such a current detecting apparatus, a current detecting apparatus of a magnetic proportion system or a current detecting apparatus of a magnetic balance system may be employed.

The current detecting apparatus of the magnetic proportion system or the magnetic balance system includes, for example, a magnetic core and a magnetoelectric device as shown in JP-A-10-104279, JP-A-2006-166528 and JP-A-2009-58451. The magnetic core is a substantially ring-shaped magnetic substance having both ends opposing each other via a gap portion and formed continuously around the periphery of a hollow portion where the bass bar penetrates through. The hollow portion of the magnetic substance is a space (current detecting space) in which a detected current passes.

In the current detecting apparatus of the related art, the magnetic core has a structure in which substantially ring-shaped plural thin panel-shaped members formed of a magnetic material are laminated via an adhesive agent. The magnetic core having such a structure is referred to as a laminated type magnetic core, hereinafter.

The magnetoelectric device is an element arranged in the gap portion of the magnetic core, and configured to detect a magnetic flux varying in accordance with the electric current flowing through the bass bar arranged through the hollow portion and output a magnetic flux detection signal as an electric signal. As the magnetoelectric device, a Hall element is employed in general.

SUMMARY OF THE INVENTION

Problems to be Solved by the Invention

Incidentally, in the current detecting apparatus of the related art, a plate-shaped bass bar is inserted into the hollow portion of the magnetic core, the magnetic core is needed to be formed to have a maximum width (diameter) of the hollow portion larger than the width of the bass bar. In contrast, in the electric vehicles and the hybrid vehicles, a wider bass bar is in a growing acceptance in order to prevent the bass bar from generating excessive heat in association with an increase of the electric current flowing through the bass bar.

Therefore, the current detecting apparatus of the related art has a problem in that the larger the width of the bass bar, the larger magnetic core proportional to the width of the bass bar is required, and hence a space required for installation of the apparatus is increased. In particular, when the magnetic core has a ring shape, an ellipsoidal ring shape, or a square ring shape having a ratio of the vertical dimension and the lateral dimension 1:1, or close to 1:1, a useless space in the hollow portion of the magnetic core increases with an increase of the width of the bass bar.

In addition, the current detecting apparatus mounted on the vehicle receives vibrations from the vehicle. Therefore, when the bass bar formed to be thicker at a portion penetrating through the magnetic core is assumed to be secured to the bass bar on the upstream side and the downstream side by screw clamping, the screws are subject to loosening due to the vibrations. When the screws are loosened, defective contact of the connected bass bar occurs, and hence excessive heat is generated at a portion of the defective contact.

In general, when prevention of the loosening of the screws due to the vibrations is necessary, a facing ring to be sandwiched between the screw and an object to be fixed, or an adhesive agent for bonding the screw and the object to be fixed is used. However, usage of the facing ring or the adhesive agent is not preferable because an increase in number of steps for mounting the current detecting apparatus or number of steps of management of the material and an increase in cost may result.

It is an object of the present invention to provide a current detecting apparatus configured to detect an electric current flowing through a bass bar which can be reduced in size by employing a relatively small magnetic core with respect to the width of the bass bar, and prevent problems caused by excessive heat generation and vibrations of the bass bar.

Means for Solving the Problems

A current detecting apparatus according to the present invention is an apparatus configured to detect an electric current flowing through a bass bar, and includes respective components shown below.

(1) A first component is a magnetic core formed of a magnetic material, having both ends opposing each other via a gap portion, and formed continuously around the periphery of a hollow portion.

(2) A second component is a magnetoelectric device arranged on the gap portion of the magnetic core and configured to detect a magnetic flux varying in accordance with an electric current passing through the hollow portion of the magnetic core.

(3) A third component is a current detecting bass bar formed of a conductor including a through portion penetrating through the hollow portion of the magnetic core and two plate-shaped terminal portions continuing from both sides of the through portion in the direction of penetration through the hollow portion and each formed with a through hole for allowing insertion of a screw. In this current detecting bass bar, the through portion is formed to have a thickness larger than that of the terminal portions, and the two terminal portions being formed with plural projections distributed on surfaces around the through holes thereof.

In the current detecting apparatus according to the present invention, it is contemplated that the current detecting bass bar is a member having a structure in which both end portions of a metallic member which can penetrate through the hollow portion of the magnetic core are each collapsed and shaped by press working into a plate shape having a width larger than that of other portions, and hence the collapsed both end portions constitute the two terminal portions.

In the current detecting apparatus according to the present invention, preferably, top portions of the plural projections at the terminal portions of the current detecting bass bar each form an angular edge. For example, it is contemplated that the angular edges of the top portions of the plural projections at the terminal portions of the current detecting bass bar form a ridge line extending in the direction intersecting the circumference surrounding the through hole.

In the current detecting apparatus according to the present invention, preferably, the current detecting bass bar is a member formed of annealed copper or aluminum.

In the current detecting apparatus according to the present invention, it is contemplated that the plural projections are formed on both surfaces of the two terminal portions of the current detecting bass bar, and the shapes of the entirety of the plural projections formed on the respective surfaces of the two terminal portions are the same.

Advantages of the Invention

Hereinafter, in the current detecting apparatus according to the present invention, the direction in which the current detecting bass bar penetrates through the hollow portion of the magnetic core (direction of current passage) is referred to as a first direction. The width direction and the thickness direction of the terminal portions continuing from the front and back sides of the through portion penetrating through the hollow portion of the magnetic core in the current detecting bass bar are referred to as a second direction and a third direction, respectively.

In the current detecting apparatus according to the present invention, the both end portions of the current detecting bass bar are the terminal portions. In other words, the current detecting bass bar in a state of being penetrated through the hollow portion of the magnetic core can be connected later to the bass bars on the upstream side and the downstream side which are provided in advance. Therefore, the current detecting bass bar having a form different from the bass bars on the upstream side and the downstream side can be employed, and hence a compact magnetic core can be employed without being subject to a constraint from the width of the bass bars on the upstream side and the downstream side.

The through portion of the current detecting bass bar which penetrates through the hollow portion of the magnetic core is formed to have a thickness larger than that of the terminal portions continuing therefrom on the front and back sides. Accordingly, the through portion can be formed to have a larger cross-sectional area under the constraint that the width and the thickness are smaller than the width of the hollow portion of the magnetic core. Therefore, even when a relatively small magnetic core is employed, excessive heat generation of the current detecting bass bar can be prevented.

Also, in the present invention, the terminal portions of the current detecting bass bar are formed with the plural projections distributed in the periphery of the through holes for screw clamping. A projection group including the plural projections demonstrates a spring effect between the terminal portions of the current detecting bass bar and head portions of the screws, so that the loosening of the screws due to the vibrations is prevented. Also, when the projection groups are formed on both surfaces of the terminal portions of the current detecting bass bar, the projection groups demonstrate the spring effect both between the terminal portions of the current detecting bass bar and the head portions of the screws and between the terminal portions of the current detecting bass bar and the terminal portions of the other bass bars, so that the loosening of the screws due to the vibrations is prevented further reliably.

As shown above, according to the present invention, the relatively small magnetic core with respect to the widths of the bass bars on the upstream side and the downstream side of the current detecting apparatus can be employed, and hence reduction in the size of the apparatus is achieved. Furthermore, according to the present invention, the problem caused by the excessive heat generation and vibrations of the bass bar can be prevented. In addition, the facing ring and the adhesive agent for preventing the screw from loosening are not necessary, and an increase in the number of steps for mounting the current detecting apparatus or the number of steps of management of the material and increase in cost are not resulted.

Also, it is preferable if the current detecting bass bar is a member having a structure collapsed and shaped by press working at the end portions of the metallic member which can penetrate through the hollow portion of the magnetic core into a plate shape having a width larger than other portions. In this case, the plate-shaped terminal portions having a width wider than the width of the hollow portion of the magnetic core and being formed with the plural projections can be formed easily at both end portions of the non-plate shaped metallic member. As the metallic member not having the plate shape, a rod-shaped metallic member or a cylindrical shaped metallic member may be contemplated.

Also, if the top portions of the plural projections at the terminal portions each are formed to have the angular edge, the frictional resistance between the terminal portions and the head portions of the screws is increased, and the loosening of the screws due to the vibrations is prevented further reliably.

Incidentally, portions of the projection group which mainly demonstrate the spring effect are portions of the angular edges of the top portions of the respective projections. Therefore, if the angular edges of the top portions of the respective projections are distributed at a high density, the spring effect is enhanced.

For example, if the angular edge of the top portion of each of the plural projections forms a ridge line extending along the direction intersecting the circumference which surrounds the through hole, the angular edges of the top portions of the plural projections which mainly demonstrate the spring effect are distributed at a higher density, so that the spring effect of the entirety of the plural projections is further enhanced. Also, since the angular edge of the top portion of each of the plural projections forms a ridge line extending along the direction intersecting the direction of rotation of the screws, the frictional resistance between the terminal portions and the head portions of the screws is further increased. Consequently, the loosening of the screws due to the vibrations is prevented further reliably.

Also, if the current detecting bass bar is a member formed of annealed copper or aluminum having a relatively small vertical elastic coefficient, the sufficient spring effect can be obtained easily, which is preferable.

If the shapes of the entirety of the plural projections formed respectively on the both surfaces of the two terminal portions are the same on one surface and the other surface, flexibility of direction of mounting the current detecting bass bar is increased, which is preferable.

BRIEF DESCRIPTION OF THE DRAWINGS

The present invention is further described in the detailed description which follows, with reference to the noted plurality of drawings by way of non-limiting examples of exemplary embodiments of the present invention, in which like reference numerals represent similar parts throughout the several views of the drawings, and wherein.

MODE FOR CARRYING OUT THE INVENTION

Referring now to the attached drawings, an embodiment of the present invention will be described. The following embodiment is an example in which the present invention is embodied, and is not a case example which limits the technical scope of the present invention.

Figure 1:
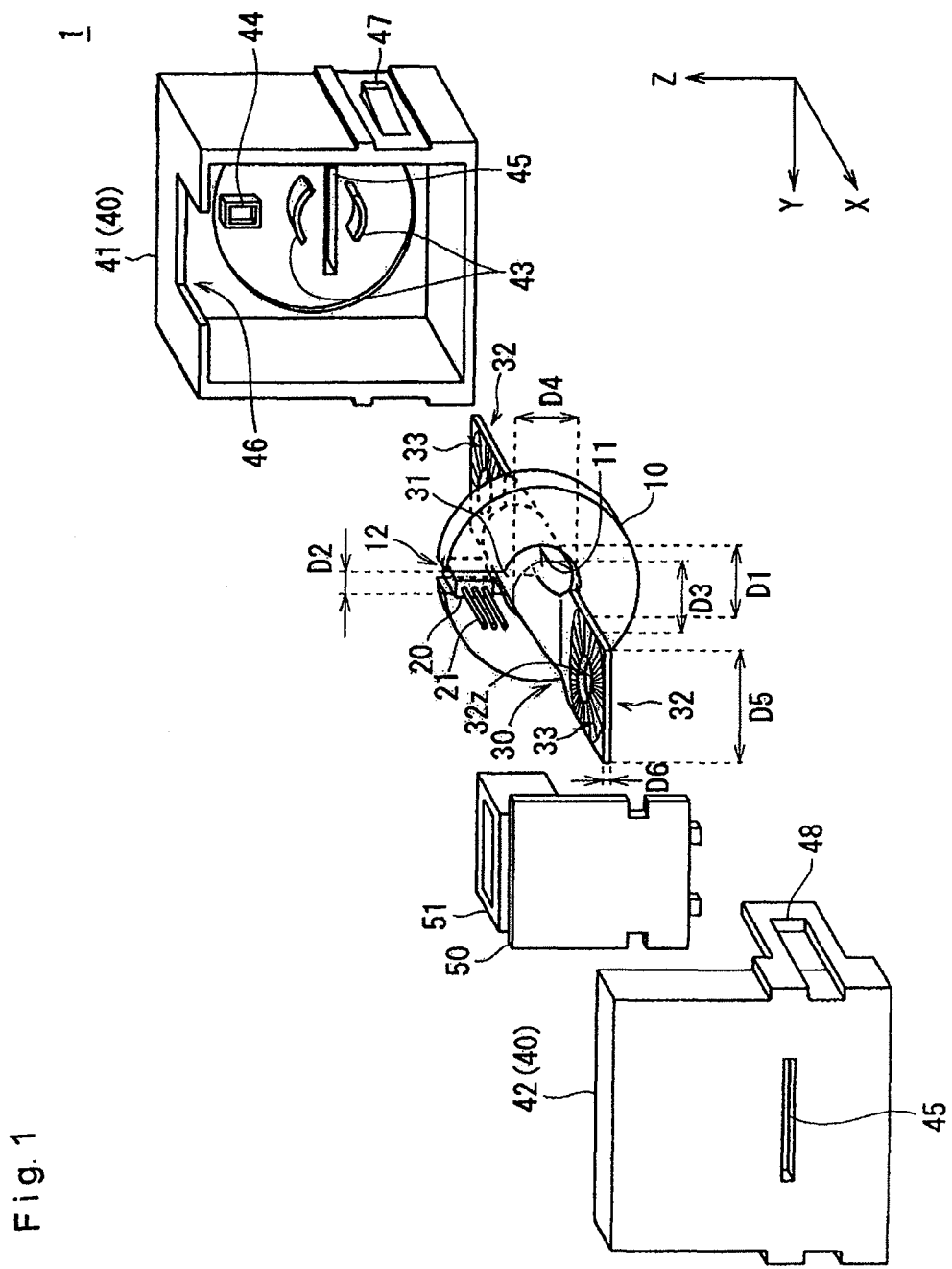
FIG. 1 is an exploded perspective view of a current detecting apparatus according to an embodiment of the present invention.

Referring now to FIG. 1 to FIG. 7, a configuration of a current detecting apparatus 1 according to the embodiment of the present invention will be described. FIG. 2(a) is a plan view, FIG. 2(b) is a side view, and FIG. 2(c) is a front view. The current detecting apparatus 1 is an apparatus configured to detect an electric current flowing through a bass bar which electrically connects a battery and equipment such as a motor in electric vehicles, hybrid vehicles, or the like. As shown in FIG. 1, the current detecting apparatus 1 includes a magnetic core 10, a Hall element 20, a current detecting bass bar 30, an insulating housing 40, and an electronic substrate 50.

<Magnetic Core>

The magnetic core 10 is a member (magnetic substance) formed of a magnetic material such as Parmalloy, ferrite, or silicon. The magnetic core 10 is, for example, a member formed by sintering powder body formed of the magnetic material. The magnetic core 10 as described above is a member solidified and shaped by compressing aggregation of solid powder formed of the magnetic material in a mold frame, and also heating the same at a temperature lower than a fusing point of the magnetic material. Alternatively, the magnetic core 10 may be a laminated-type magnetic core.

The magnetic core 10 has a shape having both ends opposing each other via a gap portion 12 of a width on the order of several millimeters and formed continuously around the periphery of a hollow portion 11. In other words, the magnetic core 10 is substantially formed into a ring shape although having the narrow gap portion 12. The magnetic core 10 in this embodiment is formed into a circular ring shape surrounding the circular hollow portion 11.

<Hall Element (Magnetoelectric Device)>

The Hall element 20 is an example of a magnetoelectric device arranged in the gap portion 12 of the magnetic core 10, and configured to detect a magnetic flux varying in accordance with an electric current passing through the hollow portion 11 of the magnetic core 10 and output a magnetic flux detection signal as an electric signal.

<Electronic Substrate>

The electronic substrate 50 is a substrate including a circuit to be connected to a terminal 21 of the Hall element 20, and a connector 51 configured to connect the circuit and another external circuit mounted thereon. Therefore, the connector 51 is electrically connected to the Hall element 20. The circuit mounted on the electronic substrate 50 includes a circuit configured to amplify the magnetic flux detection signal supplied from the Hall element 20. The Hall element 20 is connected to the external circuit via the electronic substrate 50 including the connector 51.

<Current Detecting Bass Bar>

The current detecting bass bar 30 is a conductor formed of a metal having a relatively small vertical elastic coefficient such as annealed copper or aluminum, and is part of the bass bar which electrically connects the battery and the electrical equipment. In other words, an electrical current as an object to be detected flows through the current detecting bass bar 30. Also, the current detecting bass bar 30 is a member independent from a battery-side bass bar connected in advance to the battery and an equipment-side bass bar connected in advance to the electrical equipment.

The current detecting bass bar 30 is connected at both ends thereof to other bass bars (the battery-side bass bar and the equipment-side bass bar) on the upstream side and the downstream side provided in advance. The current detecting bass bar 30 and other bass bars on the upstream side and the downstream side connected thereto form a current transmission route from the battery to the electrical equipment.

As shown in FIG. 1, the current detecting bass bar 30 is formed of a member, which is a rod-shaped conductor passing through the hollow portion 11 of the magnetic core 10 and processed on both end portions thereof. The processed both end portions of the current detecting bass bar 30 are two terminal portions 32 connected to respective connecting ends on the upstream side and the downstream side of the current transmission route. In other words, the current detecting bass bar 30 is a member formed of a conductor roughly including a rod-shaped through portion 31 which occupies a certain range at a center portion, and the two terminal portions 32 formed so as to continue from the through portion 31 on both sides in the direction of penetration through the hollow portion 11.

The through portion 31 is a portion penetrating through the hollow portion 11 of the magnetic core 10 along the direction of passage of the electric current, and the cross-sectional shape thereof is not flat. The direction of passage of the electric current corresponds to the direction of thickness of the magnetic core 10, and when the ring-shaped magnetic core 10 is regarded as a cylinder, to the axial direction of the cylinder, and also to the direction orthogonal to a plane formed by the ring-shaped magnetic core 10. In the respective drawings, the direction of passage of the electrical current is expressed as an X-axis direction. In the following description, the direction of passage of the electrical current (X-axis direction) is referred to as a first direction.

The through portion 31 of the current detecting bass bar 30 is formed into a rod shape such as a circular-cylindrical shape or an elliptic-cylindrical shape, for example, and the cross-sectional shape thereof is not a flat shape. In contrast, the two terminal portions 32 are both formed into a flat shape. The through portion 31 is formed to have a larger thickness than each of the two terminal portions 32.

The respective two terminal portions 32 are formed with through holes 32Z which allow insertion of screws for connecting the terminal portions 32 and terminal portions of the bass bars on the upstream side or the downstream side. As described later, the terminal portions 32 are connected to other bass bars with the screws on the upstream side and the downstream side.

In the respective drawings, the width direction and the thickness direction of the terminal portions 32 are expressed respectively as a Y-axis direction and a Z-axis direction. In the following description, the width direction (Y-axis direction) and the thickness direction (Z-axis direction) of the terminal portions 32 are referred to as a second direction and a third direction, respectively.

The structure of the two terminal portions 32 will be described below further in detail. The two terminal portions 32 are both formed into a plate shape, and each of surfaces of the peripheries of the through holes 32Z on both surfaces of the two terminal portions 32 is formed with plural projections distributed thereon. The plural projections formed so as to be distributed on the surfaces of the respective terminal portions 32 are referred to as a projection group 33, hereinafter.

Figure 2A:
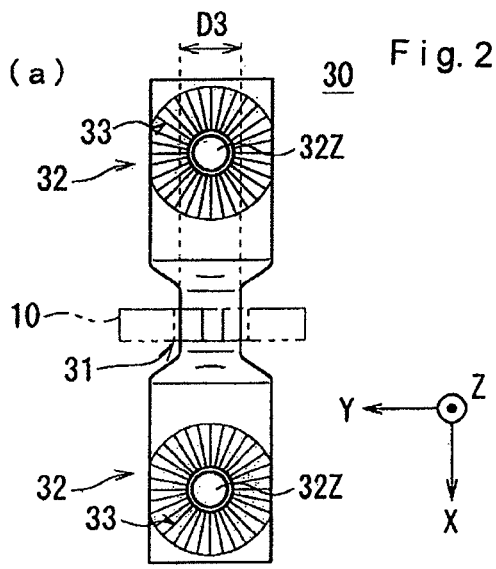
FIGS. 2(a)-2(c) show a current detecting bass bar provided in the current detecting apparatus of FIG. 1 in three views.
Figure 2B:
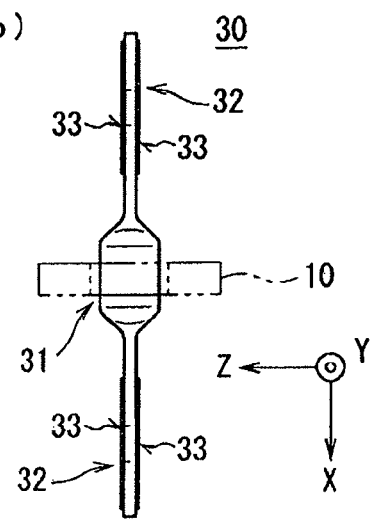
Figure 2C:
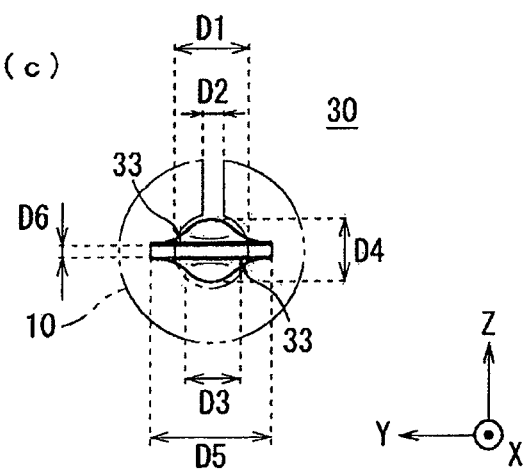
Figure 3:
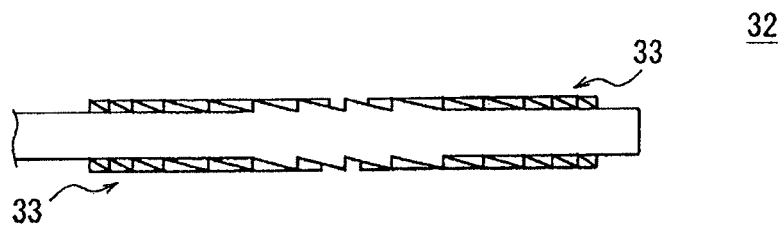
FIG. 3 is a side view of a terminal portion of the current detecting bass bar.

As shown in FIG. 3, the respective projections which constitute each projection group 33 each have a top portion taking the form of an acute angle. In addition, as shown in FIG. 2(a), the respective projections which constitute the projection group 33 are projections each having a shape in which an angular edge of the top portion forms a ridge line extending along the direction intersecting the circumference which surrounds the through hole 32Z.

In the example shown in FIG. 2(a), the respective projections which constitute each projection group 33 are projections each having a shape in which the angular edge of the top portion forms a ridge line extending along a straight line orthogonal to the circumference having its center at the center of the through hole 32Z. In other words, the top portions of the respective projections which constitute the projection group 33 form ridge lines along the straight lines extending radially from the center of the through hole 32Z.

Also, as shown in FIG. 3, the angular edges of the top portions of the respective projections which constitute each projection group 33 are formed so that a plane which divides the angular edge in half is inclined with respect to the direction vertical to the surface of the terminal portions 32. More specifically, the respective projections which constitute the projection group 33 are formed so that the plane which divides the angular edge of the top portion in half is inclined into the direction against the direction of rotation of the screw when the screw is loosened. In other words, the outline of the cross section of the projection group 33 is formed into a saw blade shape whose blade edges are directed to the direction of tightening of the screw. The direction of tightening of the screw is generally a clockwise direction around the through hole 32Z.

Also, the shapes of the entirety of the projection groups 33 formed on the both surfaces of each of the two terminal portions 32 are the same on one surface and the other surface.

Figure 4:
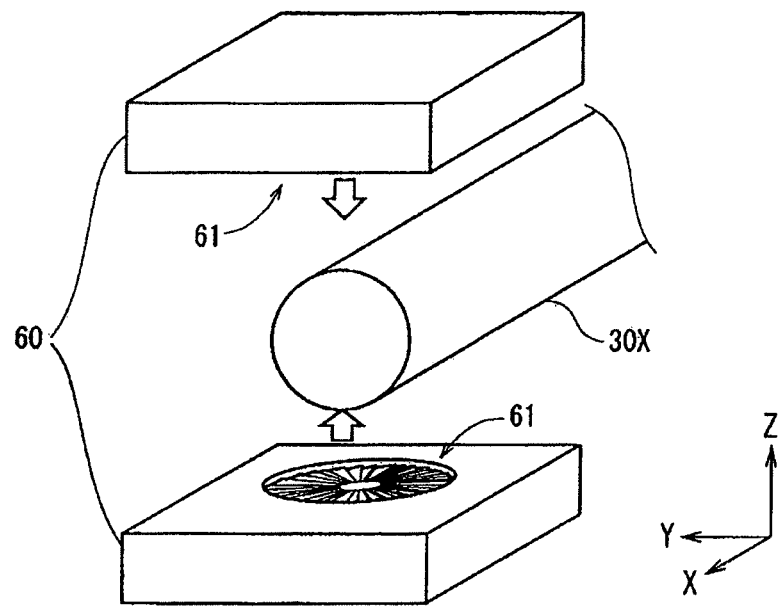
FIG. 4 is a schematic perspective view of a manufacturing step of the current detecting bass bar.

FIG. 4 is a schematic perspective view of a manufacturing step of the current detecting bass bar 30. The current detecting bass bar 30 has a structure of a rod-shaped metallic member 30X processed on both end portions thereof. The width and the thickness of the rod-shaped metallic member 30X are formed to be larger than a gap height D2, which corresponds to the distance between the both ends of the magnetic core 10.

Since the metallic member 30X shown in FIG. 4 has a column shape, the width and the thickness of the metallic member 30X correspond to the diameter of the metallic member 30X.

More specifically, the current detecting bass bar 30 is a member having a structure collapsed by press working at portions over a certain range at both ends of the rod-shaped metallic member 30X penetrating through the hollow portion 11 of the magnetic core 10 using a press machine 60 or the like into a plate shape having a width larger than that of other portions.

In other words, in the steps of manufacturing the current detecting apparatus 1, the steps of manufacturing the current detecting bass bar 30 include a first pressing step for collapsing one of the end portions of the rod-shaped metallic member 30X into the plate shape having a width larger than the other portions by the press machine 60 or the like, and a second pressing step for collapsing the other end portion of the rod-shaped metallic member 30X into the plate shape having a width larger than the other portions by the press machine 60 or the like.

Then, the both end portions collapsed into a flat shape constitute the two plate-shaped terminal portions 32 of the current detecting bass bar 30, and a rod-shaped portion therebetween constitutes the through portion 31 of the current detecting bass bar 30.

As shown in FIG. 4, each one of a pair of press-contact portions of the press machine 60 used in the pressing process is provided with a toothed portion 61 for shaping the projection groups 33 of the terminal portions 32. By the pressing step using the press machine 60 as shown in FIG. 4, the shaping of the terminal portions 32 formed with the projection groups 33 on the surfaces thereof is performed.

The metallic member 30X shown in FIG. 4 is a circular cylindrical-shaped member, and the through portion 31 of the current detecting bass bar 30 manufactured by the process on the both ends of the metallic member 30X described above has a circular cylindrical shape. The rod-shaped metallic member 30X may be an ellipsoidal rod shape having an ellipsoidal cross section or a square rod shape having a square cross section. Alternatively, the rod-shaped metallic member 30X may be a rod shape having a polygonal cross section other than the square.

The cross-sectional shape of the metallic member 30X, that is, the cross-sectional shape of the through portion 31 is preferably a shape similar to the outline shape of the hollow portion 11 of the magnetic core 10. For example, assuming that a value N is an integer number of 3 or larger, when the outline shape of the hollow portion 11 of the magnetic core 10 is a regular N-gon shape, the shape of the metallic member 30X is preferably a regular N-gonal column shape. When the outline shape of the hollow portion 11 of the magnetic core 10 is a circular shape, the shape of the metallic member 30X is preferably a circular column shape. In the same manner, when the outline shape of the hollow portion 11 of the magnetic core 10 is an ellipsoidal shape having a ratio R between the long axis and the short axis, the shape of the metallic member 30X is preferably an ellipsoidal column shape having the ratio R between the long axis and the short axis in cross section.

In the current detecting bass bar 30, a width D5 of each of the two terminal portions 32 is formed to be larger than a diameter D1 (width) of the hollow portion 11. Also, a thickness D4 (diameter) of the through portion 31 is formed to be larger than a thickness D6 of the flat terminal portions 32. In other words, a ratio between the vertical dimension and the lateral dimension of the outline of the cross-section of the through portion 31 is closer to "1" in comparison with a ratio between the vertical dimension and the lateral dimension of the cross section of the flat terminal portions 32. When the through portion 31 has a circular column shape, the thickness D4 and a width D3 of the through portion 31 are the same. Also, the expression, "a ratio is close to "1"" includes the case of "a ratio is "1"".

Figure 5:
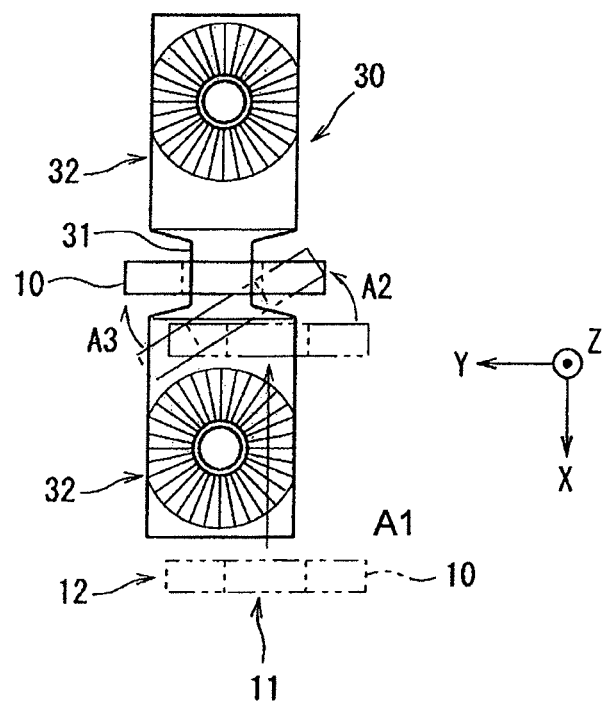
FIG. 5 is a plan view showing a state in which a magnetic core is mounted on a through portion of the current detecting bass bar.

The magnetic core 10 and the current detecting bass bar 30 are assembled in a procedure shown in FIG. 5, for example. FIG. 5 is a plan view showing a state in which the magnetic core 10 is mounted in the through portion 31 of the current detecting bass bar 30.

When the magnetic core 10 and the current detecting bass bar 30 are assembled, first of all, the terminal portions 32 of the current detecting bass bar 30 are inserted into a space extending from the hollow portion 11 to the gap portion 12 of the magnetic core 10 as shown by an arrow A1 in FIG. 5.

Subsequently, as shown by an arrow A2 in FIG. 5, the magnetic core 10 is moved so that part of the through portion 31 of the current detecting bass bar 30 enters part of the hollow portion 11 of the magnetic core 10. Accordingly, a portion of the current detecting bass bar 30 extending from the part of the through portion 31 to part of the terminal portion 32 is brought into a state of being inserted into the space extending from the hollow portion 11 to the gap portion 12 of the magnetic core 10.

Finally, as shown by an arrow A3 in FIG. 5, the magnetic core 10 is moved so that the terminal portion 32 of the current detecting bass bar 30 leaves the gap portion 12 of the magnetic core 10, and hence the through portion 31 of the current detecting bass bar 30 penetrates through the hollow portion 11 of the magnetic core 10. With the procedure as described above, the current detecting bass bar 30 is assembled with the magnetic core 10 in a state in which the through portion 31 penetrates through the hollow portion 11 of the magnetic core 10.

For reference sake, a configuration in which at least one of the both ends of the rod-shaped metallic member 30X is subject to the press working into a plate shape after the rod-shaped metallic member 30X is inserted into the hollow portion 11 of the magnetic core 10 is also applicable.

Then, after a set of the magnetic core 10 and the current detecting bass bar 30 in a state of being penetrated through the hollow portion 11 of the magnetic core 10 is prepared, the current detecting bass bar 30 is connected to the other bass bars on the upstream side and the downstream side.

Figure 7:
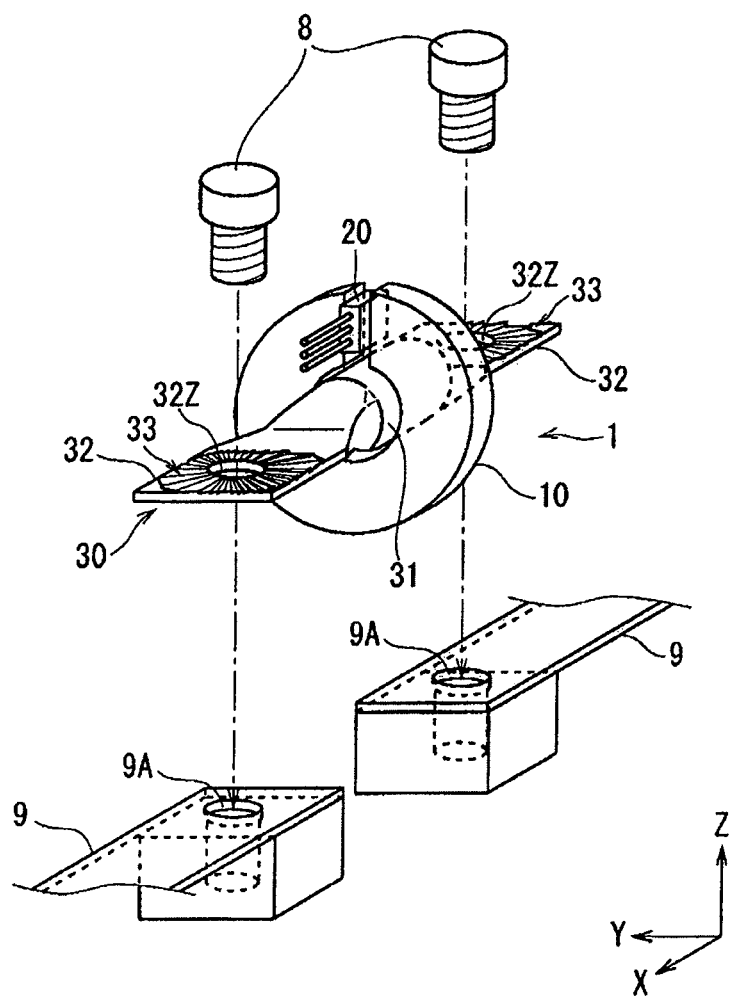
FIG. 7 is a schematic perspective view showing a state in which the current detecting apparatus is connected to the bass bar provided in advance.

FIG. 7 is a schematic perspective view showing a state in which the two terminal portions 32 of the current detecting apparatus 1 are connected to other bass bars 9 on the upstream side and the downstream side provided in advance in a storage box such as a power box with screws 8.

In FIG. 7, illustration of the insulating housing 40 is omitted for the sake of convenience. As shown in FIG. 7, connecting ends of the other bass bars 9 to be connected to the terminal portions 32 are each provided with, for example, a structure as a terminal base, and are each formed with a hole 9A for screw clamping.

The screw 8 is inserted into the through hole 32Z of each of the two terminal portions 32 of the current detecting bass bar 30 and the hole 9A of one of the other bass bars 9 on the upstream side or the downstream side and is tightened to the screw hole formed on a base which supports the bass bar 9. Accordingly, the two terminal portions 32 of the current detecting bass bar 30 are fixed to the bases respectively in a state of being electrically connected to the respective other bass bars 9 on the upstream side and the downstream side.

Also, when the two terminal portions 32 and the other bass bars 9 on the upstream side and the downstream side are connected respectively with the screws 8, the projection group 33 on one of the surfaces of each of the two terminal portions 32 is interposed between the terminal portion 32 and the screw 8, and the projection group 33 on the other surface is interposed between the terminal portion 32 and the other bass bar 9.

<Insulating Housing>

The insulating housing 40 is formed of an insulating material, is a member for holding the magnetic core 10, the Hall element 20, the current detecting bass bar 30, and the electronic substrate 50, and includes a main body case 41 and a lid member 42 attached to the main body case 41. The main body case 41 and the lid member 42 are each an integrally molded member formed of insulative resin such as polyamide (PA), polypropylene (PP), polybutylene terephthalate (PBT), or ABS resin.

The main body case 41 is formed into a box shape having an opening, and the lid member 42 closes the opening of the main body case 41 by being attached to the main body case 41. The main body case 41 is formed with first holding portions 43 and a second holding portion 44 projecting from an inner side surface thereof. The main body case 41 holds the magnetic core 10, the current detecting bass bar 30 penetrating through the hollow portion 11, and the Hall element 20 arranged in the gap portion 12 by the first holding portions 43 and the second holding portion 44 so that these members are kept out of contact from each other.

More specifically, the first holding portions 43 hold the magnetic core 10 and the current detecting bass bar 30 by being fitted into a gap between the magnetic core 10 and the through portion 31 of the current detecting bass bar 30 penetrating through the hollow portion 11 thereof so that these members are kept out of contact from each other. The second holding portion 44 holds the magnetic core 10 and the Hall element 20 by being fitted into a gap between the magnetic core 10 and the Hall element 20 arranged in the gap portion 12 thereof so that these members are kept out of contact from each other.

Also, the main body case 41 and the lid member 42 are each formed with a bass bar hole 45, which is a slit-shaped through hole which allows penetration of each of the terminal portions 32 on the both ends of the current detecting bass bar 30 from the inside to the outside. In a state in which one of the terminal portions 32 of the current detecting bass bar 30 penetrating through the hollow portion 11 of the magnetic core 10 is passed through the bass bar hole 45 of the main body case 41, the first holding portions 43 and the second holding portion 44 of the main body case 41 hold the magnetic core 10, the Hall element 20, and the current detecting bass bar 30.

The lid member 42 is mounted to the main body case 41 which holds the magnetic core 10, the Hall element 20, and the current detecting bass bar 30 so as to close the opening of the main body case 41 while placing the electronic substrate 50 interposed therebetween. In this case, the other terminal portion 32 of the current detecting bass bar 30 is inserted through the bass bar hole 45 of the lid member 42 from inside to outside.

By the electronic substrate 50 interposed between the main body case 41 and the lid member 42, the connector 51 mounted on the electronic substrate 50 is held in a state of being fitted into a notched portion 46 formed on the main body case 41.

Furthermore, the main body case 41 and the lid member 42 are provided with locking mechanisms 47, 48 which hold each other in a combined state, respectively. The locking mechanisms 47, 48 shown in FIG. 1 include claw portions 47 formed to project from side surfaces of the main body case 41 and ring-shaped frame portions 48 formed on the sides of the lid member 42. The main body case 41 and the lid member 42 are held each other in an assembled state by the claw portions 47 on the main body case 41 fitted into holes formed by the frame portions 48 of the lid member 42.

Figure 6:
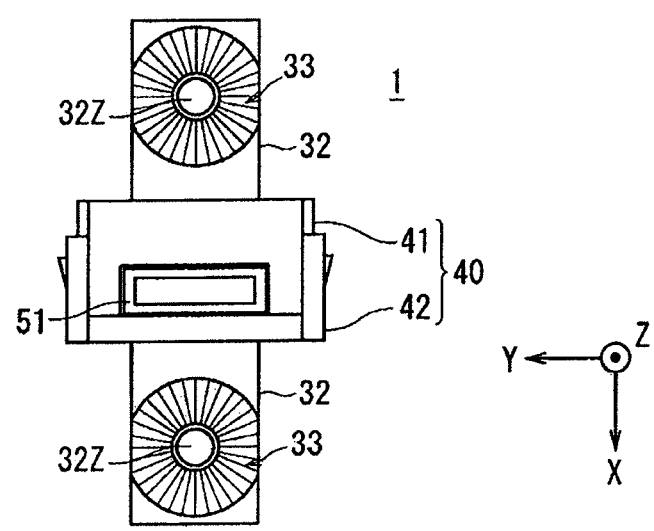
FIG. 6 is a plan view of the current detecting apparatus.

FIG. 6 is a plan view of the current detecting apparatus 1 in a state in which the main body case 41 and the lid member 42 are assembled. As shown in FIG. 6, the main body case 41 and the lid member 42 (the insulating housing 40) are assembled from both sides of the magnetic core 10. When the main body case 41 and the lid member 42 are assembled to each other, the magnetic core 10, the through portion 31 of the current detecting bass bar 30, and the Hall element 20 are covered and supported in a certain positional relationship in a state in which respective portions of the two terminal portions 32 of the current detecting bass bar 30 where the through holes 32Z are formed and the connector 51 of the electronic substrate 50 are exposed to the outside.

<Advantages>

In the current detecting apparatus 1 described above, the both end portions of the current detecting bass bar 30 are the terminal portions 32. In other words, the current detecting bass bar 30 in a state of being penetrated through the hollow portion 11 of the magnetic core 10 can be connected later to the bass bars 9 on the upstream side and the downstream side which are provided in advance. Therefore, the current detecting bass bar 30 having a form different from the bass bars 9 on the upstream side and the downstream side can be employed, and hence the compact magnetic core 10 can be employed without being subject to a constraint from the width of the bass bars 9 on the upstream side and the downstream side.

The through portion 31 of the current detecting bass bar 30 which penetrates through the hollow portion 11 of the magnetic core 10 is formed to have a thickness larger than that of the terminal portions 32 continuing therefrom on the front and back sides. Accordingly, the through portion 31 can be formed to have a larger cross-sectional area under the constraint that the width D3 and the thickness D4 are smaller than the width D1 of the hollow portion 11 of the magnetic core 10. Therefore, even when the relatively small magnetic core 10 is employed, excessive heat generation of the current detecting bass bar 30 can be prevented.

Also, the terminal portions 32 of the current detecting bass bar 30 are formed with the plural projections distributed in the periphery of the through holes 32Z for screw clamping. The projection groups 33 including the plural projections demonstrate a spring effect between the terminal portions 32 of the current detecting bass bar 30 and head portions of the screws 8, so that loosening of the screws 8 due to the vibrations is prevented.

In this embodiment, the projection groups 33 are formed on the both surfaces of the terminal portions 32 of the current detecting bass bar 30. Therefore, the projection groups 33 demonstrate the spring effect both between the terminal portions 32 of the current detecting bass bar 30 and the head portions of the screws 8 and between the terminal portions 32 of the current detecting bass bar 30 and the terminal portions of the other bass bars 9, so that the loosening of the screws 8 due to the vibrations is prevented further reliably.

As shown above, by the employment of the current detecting apparatus 1, the relatively small magnetic core 10 with respect to the widths of the bass bars 9 on the upstream side and the downstream side can be employed, and hence reduction in the size of the apparatus is achieved. Furthermore, the problem caused by the excessive heat generation and vibrations of the bass bar can be prevented. In addition, the facing ring and the adhesive agent for preventing the screws 8 from loosening are not necessary, and an increase in the number of steps for mounting the current detecting apparatus 1 or the number of steps of management of the material and an increase in cost are not resulted.

Also, the current detecting bass bar 30 has a structure in which the end portions of the metallic member 30X which can penetrate through the hollow portion 11 of the magnetic core 10 are collapsed and shaped by press working into a plate shape having a width larger than that of other portions. In this case, the plate-shaped terminal portions 32 having the width larger than the width D1 of the hollow portion 11 of the magnetic core 10 and each being formed with the projection group 33 can be formed easily at the both end portions of the non-plate shaped metallic member 30X. As the metallic member not having the plate shape, a rod-shaped metallic member or a cylindrical-shaped metallic member may be contemplated.

Also, since the top portions of the plural projections which constitute the projection groups 33 of the terminal portions 32 each are formed to have the angular edge, the frictional resistance between the terminal portions 32 and the head portions of the screws 8 is increased, and the loosening of the screws 8 due to the vibrations are prevented further reliably.

Incidentally, portions of the projection groups 33 which mainly demonstrate the spring effect are the top portions of the respective projections. In the current detecting apparatus 1, the angular edges of the respective top portions of the plural projections which constitute the projection groups 33 form ridge lines extending along the direction intersecting the circumference which surrounds the through holes 32Z. Therefore, the angular edges of the top portions of the plural projections which mainly demonstrate the spring effect are distributed at a higher density, and hence a high spring effect is obtained by the entirety of the projection groups 33. In addition, since the angular edges of the top portions of the projections which constitute the projection groups 33 form ridge lines extending along the direction intersecting the direction of rotation of the screws 8, the frictional resistance between the terminal portions 32 and the head portions of the screws 8 is further increased. Consequently, the loosening of the screws 8 due to the vibrations is prevented further reliably.

Also, if the current detecting bass bar 30 is a member formed of annealed copper or aluminum having a relatively small vertical elastic coefficient, the sufficient spring effect can be obtained easily, which is preferable.

Since the shapes of the entirety of the projection groups 33 formed respectively on the both surfaces of the two terminal portions 32 are the same on one surface and the other surface, flexibility of direction of mounting the current detecting bass bar 30 is increased, which is preferable.

<First Application>

Figure 8:
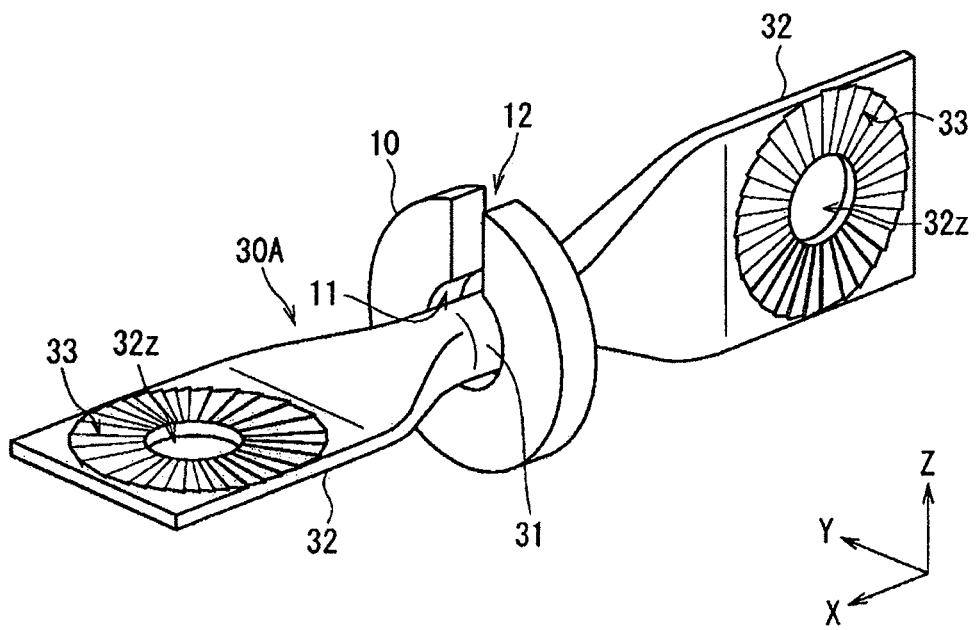
FIG. 8 is a perspective view of a current detecting bass bar and the magnetic core according to a first application which is applicable to the current detecting apparatus.

Referring now to FIG. 8, a current detecting bass bar 30A according to a first application which can be applied to the current detecting apparatus 1 will be described below. FIG. 8 is a perspective view of the current detecting bass bar 30A and the magnetic core 10.

As shown in FIG. 8, the two terminal portions 32 of the current detecting bass bar 30A are formed into a plate shape extending along planes not parallel to each other. In the example shown in FIG. 8, one of the two terminal portions 32 is formed along an X-Y plane, and the other one is formed along an X-Z plane. Employment of the current detecting bass bar 30A as shown in FIG. 8 is contemplated according to the orientation of the other bass bars 9 on the upstream side and the downstream side. The same effects as the case where the current detecting bass bar 30 is employed can be obtained also when the current detecting bass bar 30A is employed.

<Second Application>

Figure 9:
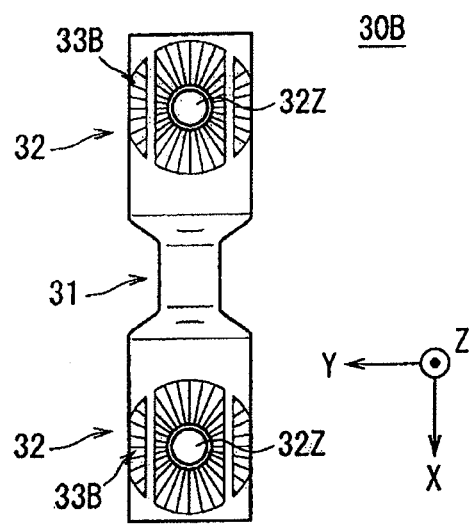
FIG. 9 is a plan view of a current detecting bass bar according to a second application which is applicable to the current detecting apparatus.

Referring now to FIG. 9, a current detecting bass bar 30B according to a second application which can be applied to the current detecting apparatus 1 will be described. FIG. 9 is a plan view of the current detecting bass bar 30B.

In the current detecting bass bar 30B, the two terminal portions 32 are formed with projection groups 33B, respectively. Respective projections of the projection groups 33B are, in the same manner as the respective projections of the projection groups 33 of the current detecting bass bar 30, projections each having a shape in which an angular edge of a top portion forms a ridge line extending along the direction intersecting the circumference which surrounds the through hole 32Z.

However, the projection groups 33B of the current detecting bass bar 30B are formed in a state of being partly divided by flat planes. Employment of the current detecting bass bar 30B as shown in FIG. 9 in the current detecting apparatus 1 is also contemplated. The same effects as the case where the current detecting bass bar 30 can be employed is obtained also when the current detecting bass bar 30B is employed.

However, when the current detecting bass bar 30B is employed, since the projection groups 33B include the flat planes in part of areas where the projection groups 33B are distributed, the effect of prevention of the loosening of the screws 8 is lowered to some extent.

<Third Application>

Figure 10:
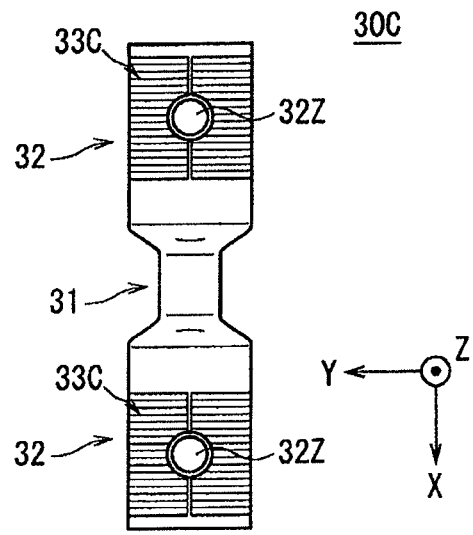
FIG. 10 is a plan view of a current detecting bass bar according to a third application which is applicable to the current detecting apparatus.

Referring now to FIG. 10, a current detecting bass bar 30C according to a third application which can be applied to the current detecting apparatus 1 will be described. FIG. 10 is a plan view of the current detecting bass bar 30C.

In the current detecting bass bar 30C, the two terminal portions 32 are formed with projection groups 33C, respectively. The respective projections of the projection groups 33C are, in the same manner as the respective projections of the projection groups 33 of the current detecting bass bar 30, projections each having a shape in which an angular edge of a top portion forms a ridge line extending along the direction intersecting the circumference which surrounds the through hole 32Z.

However, the respective projections of the projection groups 33C are projections forming ridge lines parallel to each other. In the current detecting apparatus 1, employment of the current detecting bass bar 30C as shown in FIG. 10 is also contemplated. The same effects as the case where the current detecting bass bar 30 is employed can be obtained also when the current detecting bass bar 30C is employed.

However, when the current detecting bass bar 30C is employed, since part of the ridge lines formed by the projection groups 33C is not orthogonal to the direction of rotation of the screws 8, the frictional resistance between the terminal portions 32 and the head portions of the screws 8 is lowered to some extent, and hence the effect of prevention of the loosening of the screws 8 is lowered to some extent.

<Fourth Application>

Figure 11:
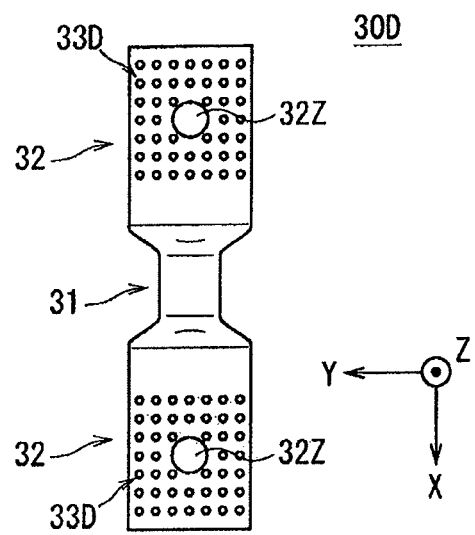
FIG. 11 is a plan view of a current detecting bass bar according to a fourth application which is applicable to the current detecting apparatus.

Referring now to FIG. 11, a current detecting bass bar 30D according to a fourth application which can be applied to the current detecting apparatus 1 will be described. FIG. 11 is a plan view of the current detecting bass bar 30D.

In the current detecting bass bar 30D, the two terminal portions 32 are formed with projection groups 33D, respectively. Respective projections of the projection groups 33D are thin column-shaped projections. The same effects as the case where the current detecting bass bar 30 is employed can be obtained also when the current detecting bass bar 30D is employed.

However, when the current detecting bass bar 30D is employed, the density of distribution of the angular edge of the top portions of the plural projections which mainly demonstrate the spring effect is lowered to some extent, and hence the effect of prevention of the loosening of the screws 8 is lowered to some extent.

<Others>

In the current detecting apparatus 1, the magnetic core 10 may be formed into a shape other than the circular ring shape, for example, polygonal ring shapes such as a square ring shape.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. A current detecting apparatus configured to detect an electric current flowing through a bass bar, the current detecting apparatus comprising:
    a magnetic core formed of a magnetic material, having both ends opposing each other via a gap portion, and formed continuously around the periphery of a hollow portion;
    a magnetoelectric device arranged in the gap portion of the magnetic core and configured to detect a magnetic flux varying in accordance with an electric current passing through the hollow portion of the magnetic core; and
    a current detecting bass bar formed of a conductor including a through portion penetrating through the hollow portion of the magnetic core, and two plate-shaped terminal portions continuing from both sides of the through portion in the direction of penetration through the hollow portion, the through portion being formed to have a thickness larger than that of the terminal portions,
    wherein each of the two plate-shaped terminal portions of the current detecting bass bar of the current detecting apparatus has a through hole and a plurality of projections embedded in the plate-shaped terminal portion of current detecting bass bar and radially distributed around the through hole, and
    the current detecting apparatus is configured so that the through portion of the current detecting bass bar is prevented from coming into contact with an interior surface of the magnetic core that forms the hollow portion of the magnetic core.

2. The current detecting apparatus according to claim 1, wherein the current detecting bass bar is a structure in which both end potions of a metallic member which can penetrate through the hollow portion of the magnetic core are each collapsed and shaped by press working into a plate shape having a width larger than that of other portions, the collapsed both end portions constituting the two terminal portions.

3. The current detecting apparatus according to claim 1, wherein the current detecting bass bar is formed of annealed copper or aluminum.

4. The current detecting apparatus according to claim 1, wherein the through hole is configured for insertion of a screw.

5. The current detecting apparatus according to claim 4, wherein top portions of the plurality of projections each form an angular edge.

6. The current detecting apparatus according to claim 5, wherein the angular edges of the top portions of the plurality of projections form a ridge line extending in the direction intersecting the circumference surrounding the through hole.

7. The current detecting apparatus according to claim 4, wherein the plurality of projections are formed on both surfaces of the two terminal portions, and the shapes of the entirety of the plurality of projections formed on the respective surfaces of the two terminal portions are the same.

* * * * *